United States Patent
Bandyopadhyay et al.

(10) Patent No.: US 10,840,797 B2
(45) Date of Patent: Nov. 17, 2020

(54) LOAD RELEASE DETECTION CIRCUIT

(71) Applicant: TEXAS INSTRUMENTS INCORPORATED, Dallas, TX (US)

(72) Inventors: Saurav Bandyopadhyay, Dallas, TX (US); Thomas Matthew LaBella, Raleigh, NC (US); Robert Allan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/670,768

(22) Filed: Oct. 31, 2019

(65) Prior Publication Data

US 2020/0169159 A1     May 28, 2020

Related U.S. Application Data

(60) Provisional application No. 62/771,469, filed on Nov. 26, 2018.

(51) Int. Cl.
*H02M 1/08*   (2006.01)
*H03K 5/24*   (2006.01)
*H02M 1/00*   (2006.01)

(52) U.S. Cl.
CPC .............. *H02M 1/083* (2013.01); *H03K 5/24* (2013.01); *H02M 2001/0058* (2013.01)

(58) Field of Classification Search
CPC . H02M 1/083; H02M 2001/0058; H03K 5/24
See application file for complete search history.

(56) References Cited

U.S. PATENT DOCUMENTS 5,594,635 A    1/1997   Gegner
5,684,688 A    11/1997  Rouaud et al.
(Continued)

FOREIGN PATENT DOCUMENTS

CN    104201884    10/2014
JP    H07123707    12/1994

OTHER PUBLICATIONS

Asad Abidi et al., "Understanding the Regenerative Comparator Circuit" Electrical Engineering Department, University of California, Los Angeles, 2014 IEEE, 8 pgs.
(Continued)

*Primary Examiner* — Emily P Pham
(74) *Attorney, Agent, or Firm* — Mark Allen Valetti; Charles A. Brill; Frank D. Cimino (57) ABSTRACT

Aspects of the disclosure provide for a circuit. In some examples, the circuit includes a first comparator, a second comparator, and a logic circuit. The first comparator includes a first input terminal coupled to a first node, a second input terminal coupled to a second node, and an output terminal. The second comparator includes a first input terminal coupled to the first node, a second input terminal coupled to a third node, and an output terminal. The logic circuit includes a first input terminal coupled to the output terminal of the first comparator, a second input terminal coupled to the output terminal of the second comparator, and an output terminal. The logic circuit is configured to determine a change in current over time based on analyzing an output signal of the first comparator and an output signal of the second comparator over a plurality of sequential cycles of operation.

20 Claims, 5 Drawing Sheets

(56) References Cited

U.S. PATENT DOCUMENTS

| | | | |
|---|---|---|---|
| 5,736,842 A | 4/1998 | Jovanovic | |
| 5,793,190 A | 8/1998 | Sahlstrom et al. | |
| 6,462,963 B1 | 10/2002 | Wittenbreder | |
| 6,853,174 B1* | 2/2005 | Inn | H02M 3/1588 323/284 |
| 7,145,316 B1 | 12/2006 | Galinski, III | |
| 7,940,033 B2 | 5/2011 | Dowlatabadi | |
| 8,259,421 B2 | 9/2012 | Nakahashi et al. | |
| 9,172,299 B2 | 10/2015 | Hamza et al. | |
| 9,350,240 B2 | 5/2016 | Dong et al. | |
| 9,673,706 B2 | 6/2017 | Matsuki | |
| 2004/0136209 A1 | 7/2004 | Hosokawa et al. | |
| 2008/0068867 A1 | 3/2008 | Yamada | |
| 2008/0136383 A1* | 6/2008 | Hasegawa | H02M 3/1588 323/271 |
| 2008/0278128 A1 | 11/2008 | Nagase | |
| 2009/0027027 A1 | 1/2009 | Lin et al. | |
| 2009/0134855 A1 | 5/2009 | Landwehr | |
| 2009/0140706 A1 | 6/2009 | Taufik et al. | |
| 2010/0061122 A1 | 3/2010 | Okubo et al. | |
| 2010/0164593 A1 | 7/2010 | Ha et al. | |
| 2010/0327834 A1 | 12/2010 | Lowe, Jr. | |
| 2011/0149610 A1 | 6/2011 | Moussaoui et al. | |
| 2011/0156685 A1 | 6/2011 | Chen et al. | |
| 2012/0099232 A1 | 4/2012 | Kuroyabu et al. | |
| 2012/0218785 A1 | 8/2012 | Glovinski | |
| 2012/0274294 A1 | 11/2012 | Lee et al. | |
| 2013/0093403 A1 | 4/2013 | Jia et al. | |
| 2013/0235631 A1 | 9/2013 | Pahlevaninezhad et al. | |
| 2013/0249520 A1 | 9/2013 | Oikarinen et al. | |
| 2014/0104952 A1 | 4/2014 | Takeuchi et al. | |
| 2014/0152271 A1 | 6/2014 | Jeong et al. | |
| 2014/0177300 A1 | 6/2014 | Lagorce et al. | |
| 2014/0232359 A1 | 8/2014 | Dash et al. | |
| 2014/0266130 A1 | 9/2014 | Chiang et al. | |
| 2015/0002115 A1 | 1/2015 | Shenoy et al. | |
| 2015/0022170 A1 | 1/2015 | Chen | |
| 2015/0162815 A1 | 6/2015 | Mikami et al. | |
| 2015/0214827 A1* | 7/2015 | Yoon | H02M 3/1588 323/286 |
| 2015/0326123 A1 | 11/2015 | Fukushima et al. | |
| 2016/0065071 A1 | 3/2016 | Matsuki et al. | |
| 2016/0233768 A1* | 8/2016 | de Cremoux | H02M 1/083 |
| 2016/0365790 A1 | 12/2016 | Ye et al. | |
| 2017/0019093 A1 | 1/2017 | Kanda et al. | |
| 2017/0063227 A1 | 3/2017 | Nakamura | |
| 2017/0126120 A1 | 5/2017 | Chakraborty et al. | |
| 2017/0154739 A1 | 6/2017 | Sugahara et al. | |

OTHER PUBLICATIONS

Behzad Razavi, "The StrongARM Latch", A Circuit for All Seasons, IEEE Solid-State Circuits Magazine, Spring 2015, pp. 12-17.

http://escholarship.org/us/item/6st6k2nz, 2.5.4 Comparator Design, pp. 27-28, 2013.

Jing Xue, Ho Lee, "A 2MHz 12-to-100V 90%-Efficiency Self-Balancing ZVS Three-Level DC-DC Regulator with Constant-Frequency AOT V2 Control and 5ns ZVS Turn-On Delay", ISSCC 2016 / Session 12 / Efficient Power Conversion / 12.5, 2016 IEEE International Solid-State Circuits Conference, Digest of Technical Papers, pp. 226-228.

Guichao Hua, Ching-Shan Leu, Yimin Jiang and Fred C.Y. Lee, "Novel Zero-Voltage-Transition PWM Converters," IEEE Trans. Power Electron., Mar. 1994, vol. 9, No. 2, pp. 213-219; accessed Nov. 11, 2016, http://coral.ufsm.br/gepocufsm/arquivos/diversos/ELC1037/Fred_Lee_(ZVT_Classic).pdf.

International Search Report from corresponding PCT Application No. PCT/US2016/069149, dated May 25, 2017 (2 pages).

International Search Report from corresponding PCT Application No. PCT/US2017/027452, dated Aug. 24, 2017 (2 pages).

* cited by examiner

FIG. 6

LOAD RELEASE DETECTION CIRCUIT

CROSS-REFERENCE TO RELATED APPLICATIONS

The present application claims priority to U.S. Provisional Patent Application No. 62/771,469, which was filed Nov. 26, 2018, is titled "LOAD RELEASE DETECTION CIRCUIT," and is hereby incorporated herein by reference in its entirety.

BACKGROUND

In at least some devices, control is exerted based on a counter that increments or decrements one unit per cycle (e.g., switching cycle, clock cycle, etc.). Based on the counter, some variable, such as a duty cycle of a signal, is controlled. When rapid changes in value to transient signals occur, this counter-based method can be too slow to effectively respond. The slow response can result in damage to components that could be mitigated by a faster response of the counter.

SUMMARY

Aspects of the present disclosure provide for a circuit. In at least some examples, the circuit includes a first comparator, a second comparator, and a logic circuit. The first comparator includes a first input terminal coupled to a first node, a second input terminal coupled to a second node, and an output terminal. The second comparator includes a first input terminal coupled to the first node, a second input terminal coupled to a third node, and an output terminal. The logic circuit includes a first input terminal coupled to the output terminal of the first comparator, a second input terminal coupled to the output terminal of the second comparator, and an output terminal. The logic circuit is configured to determine a change in current over a change in time based on analyzing an output signal of the first comparator and an output signal of the second comparator over a plurality of sequential cycles of operation.

Other aspects of the present disclosure provide for a circuit. In at least some examples, the circuit includes a power converter driver and a load release detection circuit. The power converter driver is configured to drive a power converter based at least partially on a zero voltage transition (ZVT) scheme controlled by a ZVT adaptive control loop that includes a counter that increments or decrements one unit per switching cycle of the power converter. The load release detection circuit is coupled to the power converter driver and configured to couple to the power converter. The load release detection circuit is further configured to monitor a current of the power converter, determine a rate of change of the current of the power converter according to comparisons of the current of the power converter to a plurality of reference values, and output a reset signal having an asserted value when the rate of change of the current of the power converter exceeds a threshold.

Other aspects of the present disclosure provide for a system. In at least some examples, the system includes a power converter, a power converter driver, and an adaptive control loop reset circuit. The power converter includes at least one power transistor. The power converter driver is configured to control the at least one power transistor according to an adaptive control loop that exerts control based on a counter that increments or decrements on unit per switching cycle of the power converter. The adaptive control loop reset circuit is coupled to the power converter driver and configured to receive a signal representative of a current of the at least one power transistor. The adaptive control loop reset circuit is further configured to monitor a current of the at least one power transistor. The adaptive control loop reset circuit is further configured to determine a rate of change of the at least one power transistor according to comparisons of the current of the at least one power transistor to a plurality of reference values. The adaptive control loop reset circuit is further configured to output a reset signal having an asserted value when the rate of change of the current of the at least one power transistor exceeds a threshold, the reset signal causing the power converter driver to reset the counter of the adaptive control loop to a default value without regard to a value of the counter of the adaptive loop prior to the resetting.

BRIEF DESCRIPTION OF THE DRAWINGS

For a detailed description of various examples, reference will now be made to the accompanying drawings in which.

DETAILED DESCRIPTION

Some switching power converters have a current-voltage (I-V) overlap and output capacitance (Cout) losses. The I-V overlap and Cout losses, in at least some examples, reduce efficiency of the switching converter. For example, when a high-side transistor of a power converter is turned on, a signal present at a switch node (e.g., coupled to a drain or source terminal of the transistor) rises in value. The signal present at the switch node rises in value until it approximately equals a value of a signal present at another terminal of the transistor (e.g., such as the other of the drain or source terminal of the transistor). During a period of time from when the high-side transistor is turned on until signals present at the source and drain terminals of the transistor approximately equal each other in value, the transistor both conducts current and has a voltage differential across its terminals. This combination of current conduction and voltage differential is referred to as I-V overlap and can cause high levels of power dissipation (e.g., loss), negatively affecting efficiency. Similar I-V overlap loss can occur in the low-side transistor when turned on after the high-side transistor is turned off. Additionally, each time the output capacitor of the power converter is charged or discharged, Cout losses occur, further affecting efficiency.

One approach to mitigating the losses can include implementation of a zero voltage transition (ZVT) topology for a buck power converter. When the ZVT topology is implemented for the buck power converter, in at least some examples an adaptive control loop is also implemented to optimize operation of the buck power converter over a wide range of load conditions. The adaptive control loop is, in some examples, a counter based loop in which a single count up or single count down is performed each switching cycle based on a value of an output voltage (VOUT) of the buck power converter with respect to a value of an input voltage (VIN) of the power converter. However, the counter based adaptive control loop responds slowly to large changes in output current (IOUT) draw, for example, such as in load release circumstances. In such circumstances, the slow response of the adaptive control loop can cause breakdown of components of the buck power converter, such as a high-side power field effect transistor (FET), due to a voltage present in the high-side power FET. In at least some examples, a fast load transient detection circuit (e.g., that detects and/or determines a large change in value of IOUT in a short period of time) can mitigate the chances of the high-side power FET breakdown. The mitigation is performed, for example, by resetting the adaptive control loop to a lower value without the adaptive control loop incrementally counting down to the lower value in single unit increments over an extended period of time.

At least some aspects of the present disclosure provide for a circuit that detects a load release condition. The load release condition is detected, for example, based on a change in IOUT (e.g., as would be drawn by a load) over a period of time. The change in current can be referred to in shorthand as $\Delta I$ and the change in time can be referred to as $\Delta t$ (e.g., indicating a change in time) such that the load release condition is detected by monitoring $\Delta I/\Delta t$. For example, if IOUT changes from about 5 amps (A) to about 0 A within a time period of X, the load release condition is detected. In at least some examples, X is determined according to operational characteristics of specific applications and circuit implementations. For example, X may depend on how quickly an adaptive loop can respond to a change in IOUT. In various applications and circuit implementations, the load release condition may be defined according to values suitable for those applications and circuit implementations. The monitoring is performed, in some implementations (e.g., such as load release detection implementations for use with a ZVT topology power converter), by comparing IOUT to a plurality of threshold values for a plurality of successive switching cycles of the power converter. For example, during each cycle a logic circuit receives an output of each of the comparators and records, stores, or otherwise maintains the outputs for comparison to outputs of the comparators in one or more successive switching cycles of the power converter. Based on these comparisons, the logic circuit determines whether a load release has occurred. The determination is made, in some examples, by comparing a pattern of the outputs of the comparators to a predefined pattern established to indicate a load release for the purposes of resetting an adaptive control loop. In other implementations more general than a ZVT topology, the monitoring can be performed by sampling IOUT via a sample and hold circuit that in turn feeds another sample and hold circuit on a subsequent cycle of operation of the power converter. Outputs of the sample and hold circuits are then compared by comparators to a reference value to determine whether a load release condition has occurred and the adaptive control loop should correspondingly be reset.

Figure 1:
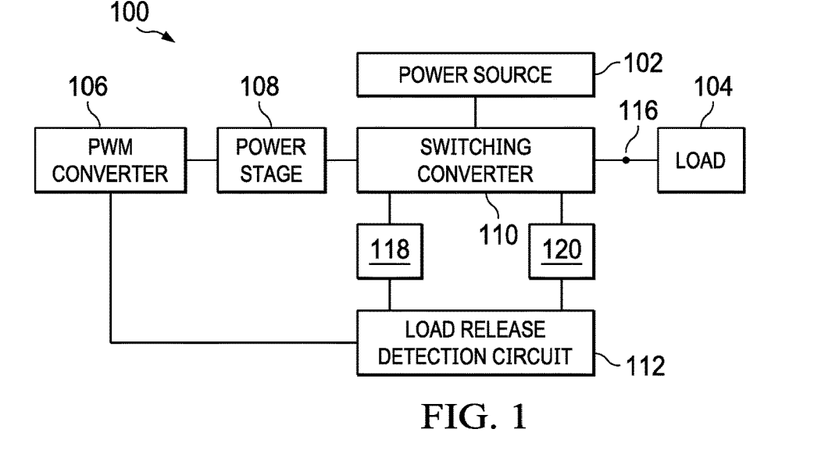
FIG. 1 shows a block diagram of an illustrative power delivery system in accordance with various examples.

Turning now to FIG. 1, a block diagram of an illustrative power delivery system 100 is shown. In at least some examples, the system 100 is representative of a device that includes, or couples to, a power source 102 and a load 104 and is configured to regulate power from the power source 102 to provide VOUT and IOUT to the load 104. In some examples, the power source 102 is a battery, while in other examples the power source 102 is a form of mains power. Additionally, in some examples the load 104 is a rechargeable battery, while in other examples the load 104 is one or more components, circuits, sub-systems, etc. which may or may not also include a rechargeable battery. For example, in various implementations the system 100 is representative of a computing device such as a smart phone, a portable computer (e.g., laptop, netbook, notebook, etc.), or an enterprise computing device, (e.g., a server computer, a networking device, etc.). In various implementations, the system 100 may further be representative of a tablet computing device, a wearable computing device (e.g., such as smart watch, smart glasses, hearing assist devices, etc.), an automobile or other transportation device, or any other suitable device that includes a power converter for regulating power from a power source to a load.

The system 100, in at least some examples, includes a pulse-width modulation (PWM) converter 106, a power stage 108, a switching converter 110, and a load release detection circuit 112 (sometimes referred to simply as a load detection circuit). In some examples, the power stage 108 is referred to as, or implemented as, a gate driver, or driver, and the PWM converter 106 and the power stage 108 together form a controller. In other examples, the PWM converter 106 alone is referred to as a controller. The PWM converter 106 is configured to receive a plurality of signals and, based at least partially on the plurality of signals, generate a PWM signal. While discussed herein as a PWM converter, the PWM converter 106 may instead be replaced by a pulse frequency modulation converter or any other suitable form of signal generation and/or output circuit suitable for generating a signal for direct or indirect use in controlling a power converter based on one or more received input signals. When the PWM converter 106 is replaced by another form of signal generation and output circuit, reference herein to the PWM signal instead should be understood as referring to an output signal of that signal generation and output circuit.

The power stage 108 is coupled to the PWM converter 106 and configured to receive the PWM signal generated and output by the PWM converter 106. Based on the PWM signal, the power stage 108 generates one or more control signals for controlling the switching converter 110. For example, based on the PWM signal the power stage 108 generates a high-side control signal (HSCTRL) and a low-side control signal (LSCTRL) and outputs HSCTRL and LSCTRL to the switching converter 110 at least partially for controlling operation of one or more transistors (not shown) of the switching converter 110. Based on HSCTRL and LSCTRL, the switching converter 110 switches power received from the power source 102 to a node 116 for providing to the load 104 when the load 104 is coupled to the node 116. The switching converter 110 is, in some examples, a boost power converter, a buck power converter, or a buck-boost power converter.

In some examples, the system 100 further includes a current sense circuit 118 and a current sense circuit 120. The current sense circuit 118 has an input terminal coupled to a high-side transistor of the switching converter 110 and the current sense circuit 120 has an input terminal coupled to a low-side transistor of the switching converter 110. Multiple architectures of current sensing circuits exist and operate according to respective processes to sense a current and output a signal representative of the sensed current. Accordingly, both the current sense circuit 118 and the current sense circuit 120 may be any suitable circuit having any suitable architecture for sensing a current and outputting a signal representative of the sensed current. The load release detection circuit 112 is configured to couple to an output terminal of the current sense circuit 120 (e.g., in the case of implementation when the switching converter 110 has a ZVT topology) or to output terminals of the current sense circuit 118 and the current sense circuit 120.

As discussed above, in at least some examples of the system 100 an adaptive control loop (not shown) is implemented to optimize performance of the switching converter 110. In various examples, the adaptive control loop is implemented in the PWM converter 106 or the power stage 108. At least some implementations of the adaptive control loop include a counter that increments or decrements by one unit during each cycle of operation of the switching converter 110. For example, when the switching converter 110 has a ZVT topology, the adaptive control loop increments or decrements based on the ZVT operation. When a drain to source voltage across the high-side transistor of the switching converter is greater than zero the adaptive control loop increments the counter. When the drain to source voltage across the high-side transistor of the switching converter is less than zero the adaptive control loop decrements the counter. The counter controls an amount of time that an auxiliary inductor (not shown) in the switching converter 110 energizes to provide the ZVT functionality. In other examples, the adaptive control loop includes a counter that directly or indirectly controls any aspect of operation of the switching converter 110 such that the present disclosure has general applicability to any circuit that includes a counter that increments or decrements by one unit per cycle of operation. The single unit per cycle change to the counter can, in some circumstances, inaccurately represent actual circuit conditions resulting from a rapid change in value associated with the circuit condition. In other examples, the counter may increment or decrement by more than one unit per cycle of operation. However, in such examples, a number of units incremented or decremented during one cycle of operation is insufficient to reach a final value. In this circumstance, multiple cycles of operation are required to respond to the rapid transient change, such as to indicate a load release.

An output of the load release detection circuit 112, in at least some examples, is provided to the adaptive control loop and/or utilized by another component to reset the adaptive control loop. In examples of the present disclosure an output terminal of the load release detection circuit 112 is shown as coupling to, and providing a loop reset signal to, the PWM converter 106. In other examples, the output terminal of the load release detection circuit 112 may instead be coupled to the power stage 108 and/or any other suitable component implemented in the system 100 or implemented external to, but coupled to, the system 100. This includes, in some examples, a processing element that monitors one or more conditions associated with the system 100 and outputs one or more control signals to at least some components of the system 100 based on that monitoring.

The load release detection circuit 112, in at least some examples, detects and monitors a rate of change in IOUT for a period of successive switching cycles of the switching converter 110. When the rate of change exceeds a threshold, the load release detection circuit 112 outputs a loop reset signal in an asserted state. The determination that the rate of change of IOUT has exceeded the threshold is made, in some implementations, by comparing IOUT to one or more threshold values and storing results of those comparisons. When the results of the comparisons over successive switching cycles of the switching converter 110 form a pattern indicating that the rate of change exceeds the threshold, the load release detection circuit 112 determines that a load release condition has occurred and outputs the loop reset signal in an asserted state. In some implementations the loop reset signal has a logical high value when in the asserted state, while in other implementations the loop reset signal has a logical low value when in the asserted state. The load release detection circuit 112 makes the determinations according to any suitable circuitry or components, for example, through analog circuitry, digital circuitry, or a combination of analog and digital circuitry.

When the loop reset signal is asserted, in at least some examples the power stage 108 resets the adaptive control loop to a default or start value. Resetting the adaptive control loop, in some examples, at least partially protects the high-side transistor of the switching converter 110 from breakdown and/or damage. The prevented breakdown or damage could otherwise result from the adaptive control loop reacting slowly to the load release condition (e.g., requiring a plurality of switching cycles to decrement the counter to the value to which the adaptive control loop is instead reset based on the loop reset signal), as discussed above.

Figure 2:
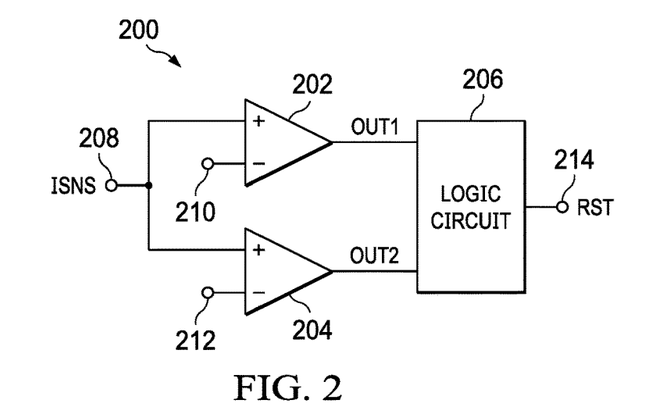
FIG. 2 shows a schematic diagram of an illustrative load detection circuit in accordance with various examples.

Turning now to FIG. 2, a schematic diagram of an illustrative load detection circuit 200 is shown. In at least some examples, the circuit 200 is suitable for implementation as the load release detection circuit 112 of the system 100 of FIG. 1. Accordingly, reference may be made to elements of FIG. 1 in describing the circuit 200. For example, the circuit 200 is suitable for at least some implementations of the system 100 in which the switching converter 110 is implemented according to a ZVT topology. In at least some examples, the circuit 200 is further suitable for implementation in any system 100 that implements, or is at least partially controlled according to, an adaptive control loop. The circuit 200, in some examples, monitors an input signal and outputs an output signal in an asserted state when a change in value of the input signals over time matches a predefined pattern. In one example, the circuit 200 includes a comparator 202, a comparator 204, and a logic circuit 206. Both the comparator 202 and the comparator 204, in at least some examples, are current sense comparators. In other examples, the comparator 202 and the comparator 204 may be sampling comparators controlled by the logic circuit 206 or another processing element. In yet other examples, the comparator 202 and the comparator 204 may be voltage sense comparators, or any other component that generates an output dependent on a comparison between two input signals. Further, although not shown, in at least some examples the comparator 202 and the comparator 204 may be clocked comparators that receive a clock signal (CLK) and output comparison results based on values of their respective input signals at a time of a rising edge of CLK.

In at least one example architecture of the circuit 200, the comparator 202 has a positive polarity input terminal coupled to a node 208 and a negative polarity input terminal coupled to a node 210. The comparator 204 has a positive polarity input terminal coupled to the node 208 and a negative polarity input terminal coupled to a node 212. An output terminal of the comparator 202 and an output terminal of the comparator 204 are each coupled to respective input terminals of the logic circuit 206, which has an output terminal coupled to a node 214.

In an example of operation of the circuit 200, a signal (ISNS) representative of IOUT is received at the node 208, a first reference signal is received at the node 210, and a second reference signal is received at the node 212. ISNS is, in some examples, a current sense signal indicating a current of a power transistor of a power converter, such as the switching converter 110. In some examples, the power transistor is a low side transistor of the power converter. ISNS is generated, in at least some examples, by a current sense device, such as the current sense device 118 and/or the current sense device 120. For example, in some implementations ISNS represents a sensed current flowing through a high-side power transistor of a power converter. In other implementations, ISNS represents a sensed current flowing through a low-side power transistor of the power converter. In some examples, the first reference signal is greater in value than the second reference signal. For example, when configured to determine whether a load release condition has occurred in a load receiving IOUT (e.g., IOUT has rapidly dropped in value) the first reference signal is greater in value than the second reference signal. Conversely, when configured to determine whether IOUT has rapidly increased in value, such as if a short occurs (e.g., a short condition) in a load receiving IOUT, the second reference signal is greater in value that the first reference signal.

When the first reference signal is not greater in value than ISNS, the comparator 202 outputs a signal (out1) having a logical high value, otherwise the comparator 202 outputs out1 having a logical low value. Similarly, when the second reference signal is not greater in value than ISNS, the comparator 204 outputs a signal (out2) having a logical high value, otherwise the comparator 204 outputs out2 having a logical low value. The logic circuit 206 receives out1 and out2 for further processing. For example, the logic circuit 206 monitors the out1 and out2 to determine whether a pattern exists in out1 and out2. For example, the logic circuit 206 monitors out1 and out2 to identify whether a predefined pattern exists in out1 and out2. The predefined pattern, in some examples, indicates the existence of a load release condition. Alternatively, in some examples the predefined pattern indicates the existence of a short condition. Based on out1 and out2, the logic circuit 206 generates a reset adaptation signal (RST). When asserted, RST indicates that a condition has been detected that dictates that an adaptive control loop associated with a power converter for which the load release has been made should be reset. The condition could be a load release, a short detection, or any other suitable detection. When de-asserted, RST indicates that no condition has been detected that dictates that the adaptive control loop should be reset.

The logic circuit 206 processes out1 and out2 to generate RST according to any suitable hardware and/or software implementation. In some examples, the processing is performed by one or more analog components. In other examples, the processing is performed by one or more digital components. In yet other examples, the processing is performed by a combination of analog and digital components. Generally, the logic circuit 206 monitors out1 and out2 to determine whether a change in IOUT over a period of time exceeds a threshold indicating that a load release condition (or other reset condition) has occurred. At least one implementation of this monitoring includes comparing successive samples of out1 and out2. For example, the logic circuit 206 may store out1 and out2 for any number of switching cycles and compare successive values of out1 and out2 to determine a rate of change of IOUT. The rate of change is determined, in at least some examples, by a pattern of values of out1 and out2. For example, in at least one implementation the logic circuit 206 determines that a load release condition has occurred and asserts RST when out1 and out2 both transition from asserted values to de-asserted values within 4 switching cycles.

Figure 3:
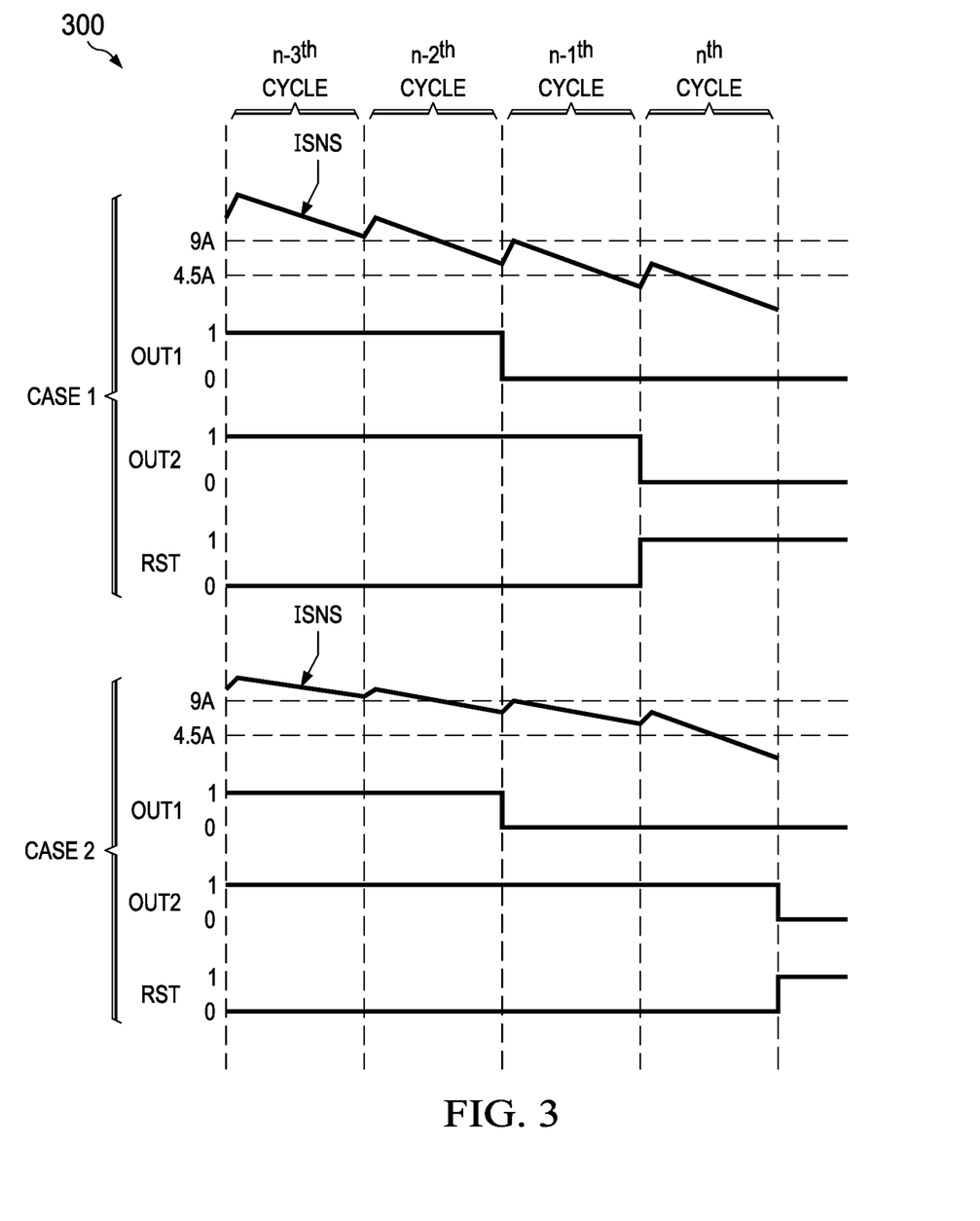
FIG. 3 shows a diagram of illustrative signals in accordance with various examples.

Turning for a moment to FIG. 3, an illustrative diagram 300 representing operation of the circuit 200 is shown. Accordingly, reference is made to components of the circuit 200 of FIG. 2 in describing the diagram 300. For the purposes of description of the diagram 300, the first reference value is indicated as 9 A and the second reference value is indicated as 4.5 A. Further, the diagram 300 is illustrated with reference to columns n, n−1, n−2, and n−3, each of which corresponds to a switching cycle, as discussed below. Additionally, an asserted signal is indicated in the diagram 300 as having a value of 1, and a de-asserted signal is indicated as having a value of 0. Various implementations of the circuit 200 may have other values for the first reference value and/or the second reference value and/or may invert the values of asserted and de-asserted signals.

Diagram 300 illustrates two exemplary cases for ISNS decreasing in value. As shown in case 1 of diagram 300, ISNS is generally decreasing in value from switching cycle to switching cycle. At a beginning of the n−3$^{th}$ switching cycle, ISNS has a value greater than both 9 A and 4.5 A. Accordingly, out1 and out2 both have asserted values. At a beginning of the n−2$^{th}$ switching cycle, ISNS continues to have a value greater than both 9 A and 4.5 A. Accordingly, out1 and out2 continue to both have asserted values. At a beginning of the n−1$^{th}$ switching cycle, ISNS has a value less than 9 A but greater than 4.5 A. Accordingly, out1 has a de-asserted value and out2 continues to have an asserted value. At a beginning of the n$^{th}$ switching cycle, ISNS has a value less than both 9 A and 4.5 A. Accordingly, out1 and out2 both have de-asserted values. Because out1 and out2 both transition from asserted values to de-asserted values within 4 switching cycles of each other in case 1, RST is asserted as a pulse signal.

Similarly, as shown in case 2 of diagram 300, ISNS is generally decreasing in value from switching cycle to switching cycle. At a beginning of the n−3$^{th}$ switching cycle, ISNS has a value greater than both 9 A and 4.5 A. Accordingly, out1 and out2 both have asserted values. At a beginning of the n−2$^{th}$ switching cycle, ISNS continues to have a value greater than both 9 A and 4.5 A. Accordingly, out1 and out2 continue to both have asserted values. At a beginning of the n−1$^{th}$ switching cycle, ISNS has a value less than 9 A but greater than 4.5 A. Accordingly, out1 has a de-asserted value and out2 has an asserted value. At a beginning of the n$^{th}$ switching cycle, ISNS continues to have a value less than 9 A but greater than 4.5 A. Accordingly, out1 has a de-asserted value and out2 has an asserted value. As further shown, for a next switching cycle after the n$^{th}$ switching cycle, ISNS will have a value less than both 9 A and 4.5 A, thus out1 and out2 will both have de-asserted values for the switching cycle after the n$^{th}$ switching cycle. Because out1 and out2 both transition from asserted values to de-asserted values within 4 switching cycles of each other in case 2, RST is again asserted as a pulse signal.

In other cases (not shown) in which out1 and out2 do not both transition from asserted values to de-asserted values within 4 switching cycles, RST is not asserted because a load release condition has not been detected. In at least some examples, other patterns are indicative of the load release condition, or another condition desired for use in determining whether to assert RST. For example, in some alternative implementations RST is asserted when out1 and out2 transition from asserted values to de-asserted values within X switching cycles, where X is any non-zero integer value. Similarly, in some alternative implementations RST is asserted when out1 and out2 transition from de-asserted values to asserted values within X switching cycles, where X is again any non-zero integer value.

Returning now to FIG. 2, in at least some examples the logic circuit 206 samples out1 and out2 once per switching cycle, such as at an end of the switching cycle, and stores the resulting values of out1 and out2. The values of out1 and out2 are stored for a number of cycles at least equal to the number of switching cycles over which changes in out1 and out2 can be indicative of a load release condition. For example, as discussed above with respect to FIG. 3, when RST is asserted based on changes in out1 and out2 within X switching cycles, the logic circuit 206 may store the values of out1 and out2 for X consecutive switching cycles. The values may be stored in any suitable storage device (not shown), such as a register, flip-flop, latch, digital logic storage structure, or any other suitable storage device capable of storing bits of data. The storage device may be clocked to sample out1 and out2, in some examples, by a same control signal as received by a gate terminal of a transistor at which ISNS is measured (e.g., a gate terminal of a low-side transistor of a power converter).

In some examples, outputs of the storage devices are processed to determine whether the load release condition has occurred. For example, one or more logic gates (not shown) receive respective outputs of the storage devices and determine whether a status (e.g., asserted or de-asserted) of out1 or out2 has changed from one switching cycle to another cycle. When the logic gates of the logic circuit 206 determine that both out1 and out2 have changed status, at least one of the logic gates generates RST having an asserted value. In at least some examples, RST is provided to another component (not shown) such as an adaptive control loop or adaptive control loop associated with a switching converter. In some examples, the adaptive control loop is implemented in a controller associated with the switching converter, a gate driver associated with the switching converter, or any other suitable component or device that interacts with the switching converter.

Figure 4:
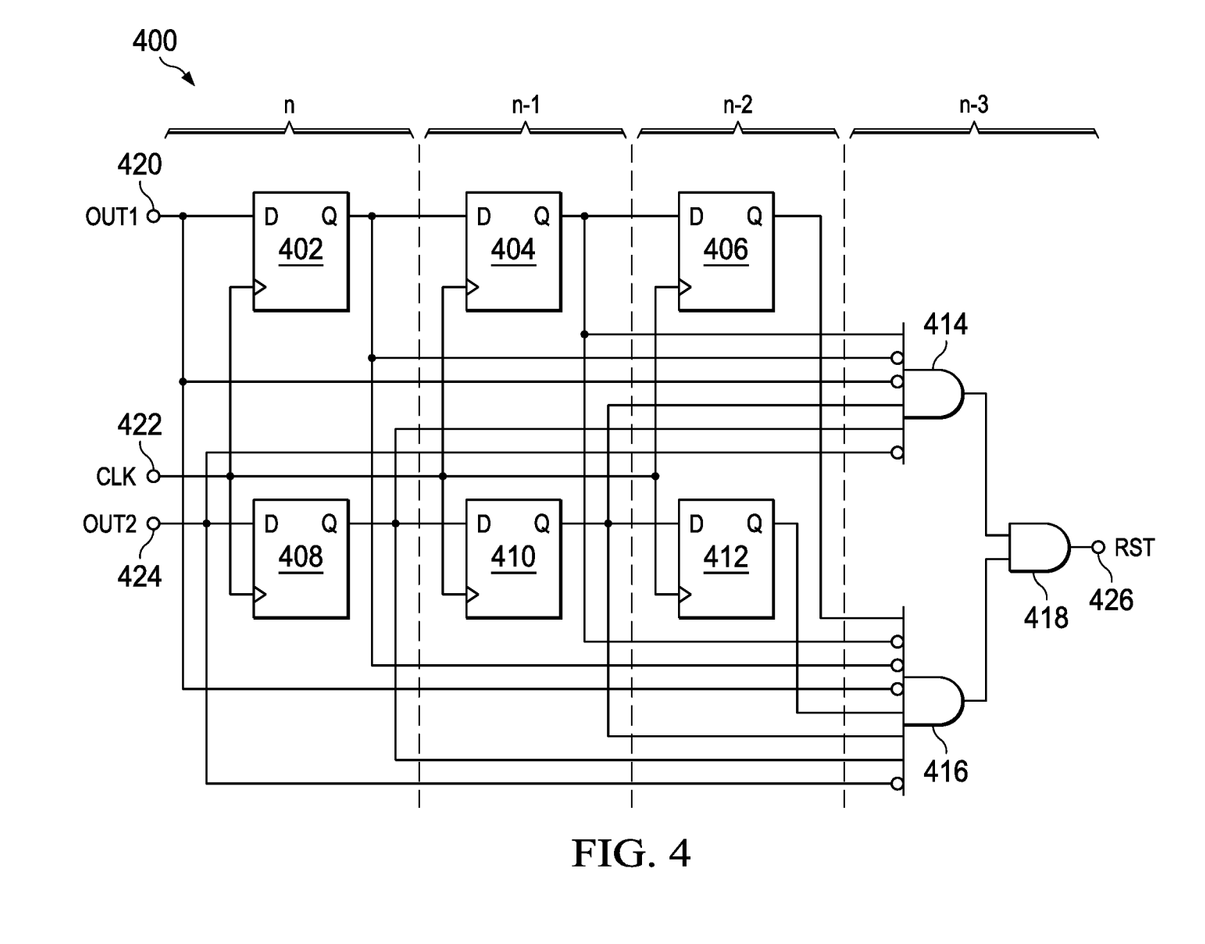
FIG. 4 shows a schematic diagram of an illustrative logic circuit in accordance with various examples.

Turning now to FIG. 4, a schematic diagram of an illustrative logic circuit 400 is shown. In at least some examples, the circuit 400 is suitable for implementation as the logic circuit 206 of the circuit 200, discussed above with respect to FIG. 2. Accordingly, reference is made in describing the circuit 400 to at least some components or signals of the circuit 200. In at least some examples, the circuit 400 includes a D flip-flop 402, a D flip-flop 404, a D flip-flop 406, a D flip-flop 408, a D flip-flop 410, a D flip-flop 412, an AND logic circuit 414, an AND logic circuit 416, and an OR logic circuit 418.

In at least one implementation of the circuit 400, the D flip-flop 402 has a data input terminal coupled to a node 420, a clock input terminal coupled to a node 422 (e.g., that receives CLK), and an output terminal coupled to a data input terminal of the D flip-flop 404. The D flip-flop 404 further has a clock input terminal coupled to the node 422 and an output terminal coupled to a data input terminal of the D flip-flop 406. The D flip-flop 406 further has a clock input terminal coupled to the node 422 and has an output terminal.

The AND logic circuit has a first input terminal coupled to the output terminal of the D flip-flop 404, a second input terminal coupled to the D flip-flop 402, and a third input terminal coupled to the node 420. The AND logic circuit 414 further has a fourth input terminal coupled to the output terminal of the D flip-flop 410, a fifth input terminal coupled to the output terminal of the D flip-flop 408, and a sixth input terminal coupled to the node 424. In some examples, the second input terminal, the third input terminal, and the sixth input terminal of the AND logic circuit 414 are inverted input terminals. Accordingly, values received at the second input terminal, the third input terminal, and the sixth input terminal of the AND logic circuit 414 are inverted prior to the AND logic circuit 414 performing an AND logical operation. Alternatively, logical inverters may be coupled to the second input terminal, the third input terminal, and the sixth input terminal of the AND logic circuit 414. In such examples, the values received at the second input terminal, the third input terminal, and the sixth input terminal of the AND logic circuit 414 have already been inverted prior to receipt by the AND logic circuit 414.

The D flip-flop 408 has a data input terminal coupled to a node 424, a clock input terminal coupled to the node 422, and an output terminal coupled to a data input terminal of the D flip-flop 410. The D flip-flop 410 further has a clock input terminal coupled to the node 422 and an output terminal coupled to a data input terminal of the D flip-flop 412. The D flip-flop 412 further has a clock input terminal coupled to the node 422 and has an output terminal.

The AND logic circuit 416 has a first input terminal coupled to the output terminal of the D flip-flop 406, a second input terminal coupled to the output terminal of the D flip-flop 404, a third input terminal coupled to the output terminal of the D flip-flop 408, and a fourth input terminal coupled to the node 420. The AND logic circuit 416 further has a fifth input terminal coupled to the output terminal of the D flip-flop 412, a sixth input terminal coupled to the output terminal of the D flip-flop 410, a seventh input terminal coupled to the output terminal of the D flip-flop 408, and an eighth input terminal coupled to the node 424. In some examples, the second input terminal, the third input terminal, the fourth input terminal, and the eighth input terminal of the AND logic circuit 414 are inverted input terminals. Accordingly, values received at the second input terminal, the third input terminal, the fourth input terminal, and the eighth input terminal of the AND logic circuit 414 are inverted prior to the AND logic circuit 414 performing an AND logical operation. Alternatively, logical inverters may be coupled to the second input terminal, the third input terminal, the fourth input terminal, and the eighth input terminal of the AND logic circuit 414. In such examples, the values received at the second input terminal, the third input terminal, the fourth input terminal, and the eighth input terminal of the AND logic circuit 414 have already been inverted prior to receipt by the AND logic circuit 414. The OR logic circuit 418 has a first input terminal coupled to an output terminal of the AND logic circuit 414, a second input terminal coupled to an output terminal of the AND logic circuit 416, and an output terminal coupled to a node 426.

In an example of operation of the circuit 400, at a first rising edge of CLK, the D flip-flop 402 stores a value of out1 as out1_1 and the D flip-flop 408 stores a value of out2 as out2_1. Clock cycles of the circuit 400 are illustrated in FIG. 4 in labeled columns, as discussed in greater detail below. At a second rising edge of CLK, the D flip-flop 402 outputs out1_1 to the D flip-flop 404 which stores out1_1. Also at the second rising edge of CLK, the D flip-flop 402 stores a value of out1 as out1_2. Further at the second rising edge of CLK, the D flip-flop 408 outputs out2_1 to the D flip-flop 410 which stores out2_1. Still further at the second rising edge of CLK, the D flip-flop 408 stores a value of out2 as out2_2. At a third rising edge of CLK, the D flip-flop 402 outputs out1_2 to the D flip-flop 404 which stores out1_2. The D flip-flop 404 outputs out1_1 to the D flip-flop 406 which stores out1_1. The D flip-flop 402 stores a value of out1 as out1_3. Further at the third rising edge of CLK, the D flip-flop 408 outputs out2_2 to the D flip-flop 410 which stores out2_2. The D flip-flop 410 outputs out2_1 to the D flip-flop 412 which stores out2_1. The D flip-flop 408 stores a value of out2 as out2_3. At a fourth rising edge of CLK, the D flip-flop 402 outputs out1_3 to the D flip-flop 404 which stores out1_3. The D flip-flop 404 outputs out1_2 to the D flip-flop 406 which stores out1_2. The D flip-flop 406 outputs out1_1. The D flip-flop 402 stores a value of out1 as out1_4. Further at the fourth rising edge of CLK, the D flip-flop 408 outputs out2_3 to the D flip-flop 410 which stores out2_3. The D flip-flop 410 outputs out2_2 to the D flip-flop 412 which stores out2_2. The D flip-flop 412 outputs out2_1. The D flip-flop 408 stores a value of out2 as out2_4. Beginning with the fifth rising edge of CLK and continuing until the circuit 400 is reset or loses power, the D flip-flop 402, the D flip-flop 404, the D flip-flop 406, the D flip-flop 408, the D flip-flop 410, the D flip-flop 412 continue operating substantially the same as the above.

Based on the above scheme, after four rising edges of CLK (e.g., four clock cycles), the circuit 400 is fully initialized and generating RST according to out1 and out1, as discussed elsewhere herein. For example, during a clock cycle n, the D flip-flop 402 contains a value of out1 at n. Similarly, the D flip-flop 404 contains a value of out1 at n−1 and the D flip-flop 408 contains a value of out1 at n−2 and is outputting a value of out1 at n−3. Also during the clock cycle n, the D flip-flop 408 contains a value of out2 at n, the D flip-flop 410 contains a value of out2 at n−1 and the D flip-flop 412 contains a value of out2 at n−2 and is outputting a value of out2 at n−3. Additionally, in at least some examples CLK is shared with one or more other components. For example, when the circuit 400 is implemented as the logic circuit 206, CLK, as received at the node 422, may also be received by (e.g., may clock) the comparator 202 and/or the comparator 204.

While the AND logic circuit 414, the AND logic circuit 416, and the OR logic circuit 418 each generate output signals for the first 3 clock cycles, the output signals do not reflect valid values because the circuit 400 is not yet fully initiated. Beginning at the fourth clock cycle, the AND logic circuit 414 generates an output AND1 based on an AND logical operation with operands of out1_2, an inversion of out1_3, an inversion of out1, out2_2, out2_3, and an inversion of out2. Similarly, beginning at the fourth clock cycle, the AND logic circuit 416 generates an output AND2 based on an AND logical operation with operands of out1_1, an inversion of out1_2, an inversion of out1_3, an inversion of out_1, out2_1, out2_2, out2_3, and an inversion of out2. The OR logic circuit 418 subsequently performs an OR logical operation with operands of AND1 and AND2 to generate RST, as discussed elsewhere herein.

Figure 5:
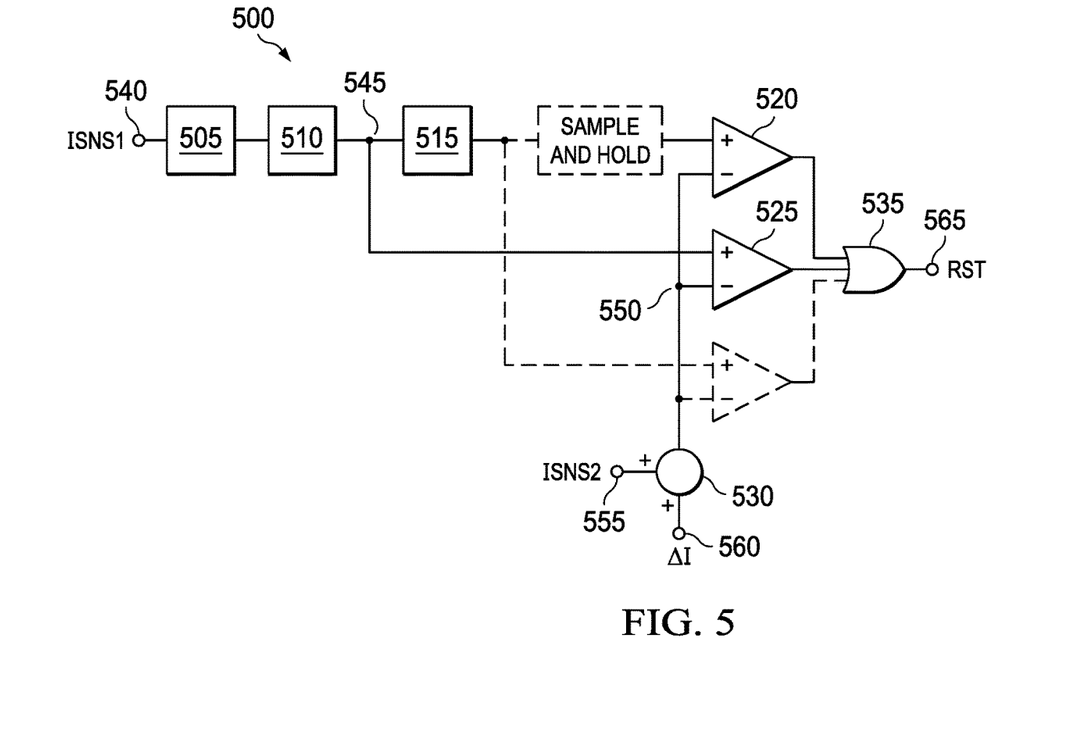
FIG. 5 shows a schematic diagram of an illustrative load detection circuit in accordance with various examples.

Turning now to FIG. 5, a schematic diagram of an illustrative load detection circuit 500 is shown. In at least some examples, the circuit 500 is suitable for implementation as the load release detection circuit 112 of the system 100 of FIG. 1. The circuit 500 is suitable for at least some implementations of the system 100 in which the switching converter 110 is implemented according to any suitable technology or topology. For example, the circuit 500 is not limited to implementation as the load release detection circuit 112 of the system 100 only when the switching converter 110 is implemented according to a ZVT topology. The circuit 500, in some examples, monitors an input signal and outputs RST in an asserted state when a change in value of the input signals over time matches a predefined pattern. In one example, the circuit 500 includes a sample and hold circuit 505, a sample and hold circuit 510, a sample and hold circuit 515, a comparator 520, a comparator 525, a summation circuit 530, and a logic circuit 535. In at least some examples, the logic circuit 535 is an OR logic circuit or another circuit suitable for performing an OR logical operation. In some examples, the circuit 500 includes additional sample and hold circuits and additional comparators. A number of sample and hold circuits in the circuit 500 may be equal to a number of switching cycles being monitored by the circuit 500 and a number of comparators in the circuit 500 may be equal to the number of sample and hold circuits minus one. To illustrate how these additional sample and hold circuits and comparators might be implemented in the circuit 500, an additional sample and hold circuit and an additional comparator are shown by broken lines. However, these additional components are not further described with respect to the circuit 500 because their operation is substantially similar to the described sample and hold circuits and comparators.

In at least one example architecture of the circuit 500, the sample and hold circuit 505 has an input terminal coupled to a node 540 and an output terminal coupled to an input terminal of the sample and hold circuit 510. The sample and hold circuit 510 has an output terminal coupled to a node 545. The sample and hold circuit 515 has an input terminal coupled to the node 545 and an output terminal. The comparator 520 has a first input terminal (e.g., a positive or non-inverting input terminal) coupled to the output terminal of the sample and hold circuit 515 and a second input terminal (e.g., a negative or inverting input terminal) coupled to a node 550. The comparator 525 has a first input terminal (e.g., a non-inverting input terminal) coupled to the node 545 and a second input terminal (e.g., an inverting input terminal) coupled to the node 550. The summation circuit 530 has a first input terminal coupled to a node 555, a second input terminal coupled to a node 560, and an output terminal coupled to the node 550. The logic circuit 535 has a first input terminal coupled to an output terminal of the comparator 520, a second input terminal coupled to an output terminal of the comparator 525, and an output terminal coupled to a node 565.

In an example of operation of the circuit 500, a first current sense signal (ISNS1) is received at the node 540, a second current sense signal (ISNS2) is received at the node 555, and a current offset value (ΔI) indicating a maximum allowable change in IOUT permitted before determining existence of a load release condition is received at the node 560. In at least some examples, ISNS1 represents a sensed current flowing through a high-side power transistor of a power converter and ISNS2 represents a sensed current flowing through a low-side power transistor of a power converter. Additionally, in at least some examples ΔI is determined according to (e.g., proportional to) a maximum ringing tolerable in a power converter from which ISNS1 and ISNS2 are determined. ISNS1 and ISNS2 are each generated and/or determined, in some examples, by respective current sense devices (not shown).

During a first switching cycle, the sample and hold circuit 505 samples ISNS1 and stores the sampled value (ISNS1_1). During a second switching cycle, the sample and hold circuit 505 outputs ISNS1_1 and samples ISNS1 again, storing ISNS1_2. The sample and hold circuit 510 samples and stores ISNS1_1 output by the sample and hold circuit 505. During a third switching cycle, the sample and hold circuit 505 outputs ISNS1_2 and samples ISNS1 again, storing ISNS1_3. The sample and hold circuit 510 outputs ISNS1_1 and samples and stores ISNS1_2 output by the sample and hold circuit 505. The sample and hold circuit 515 samples and stores ISNS1_1 output by the sample and hold circuit 510. Additionally, the comparator 525 compares a value present at the node 545 (e.g., a value of ISNS1_1 during the third switching cycle) to a value present at the node 550. When the value present at the node 545 exceeds the value present at the node 550, the comparator 525 outputs an asserted signal (e.g., a logical high value signal). Otherwise, the comparator 525 outputs a de-asserted signal (e.g., a logical low value signal). If the output of the comparator 525 is asserted, the logic circuit 535 outputs RST having an asserted value.

During a fourth switching cycle, the sample and hold circuit 505 outputs ISNS1_3 and samples ISNS1 again, storing ISNS1_4. The sample and hold circuit 510 outputs ISNS1_2 and samples and stores ISNS1_3 output by the sample and hold circuit 505. The sample and hold circuit 515 outputs ISNS1_1 and samples and stores ISNS1_2 output by the sample and hold circuit 510. The comparator 520 compares the output of the sample and hold circuit 515 (e.g., ISNS1_1 during the fourth switching cycle) to the value present at the node 550. When a value of the output of the sample and hold circuit 515 exceeds the value present at the node 550, the comparator 520 outputs an asserted signal. Otherwise, the comparator 520 outputs a de-asserted signal. If the output of the comparator 520 is asserted, the logic circuit 535 outputs RST having an asserted value. Additionally, the comparator 525 compares the value present at the node 545 (e.g., a value of ISNS1_2 during the fourth switching cycle) to the value present at the node 550. When the value present at the node 545 exceeds the value present at the node 550, the comparator 525 outputs an asserted signal. Otherwise, the comparator 525 outputs a de-asserted signal. If the output of the comparator 525 is asserted, the logic circuit 535 outputs RST having an asserted value. In at least some examples, during each switching cycle the summation circuit 530 receives and determines a sum of ISNS2 and ΔI. The sum of ISNS2 and ΔI is output by the summation circuit 530 to the node 550. The sum of ISNS2 and ΔI may be determined according to any suitable means, the scope of which is not limited herein. In at least one example, the summation circuit 530 includes a summing amplifier or other form of voltage adder configured to add ISNS2 and ΔI (e.g., when ISNS2 and ΔI are voltage signal representations of current signals). In other examples, the summation circuit 530 includes any form of current adder configured to add ISNS2 and ΔI (e.g., when ISNS2 and ΔI are current signals). In at least some examples, subsequent cycles of operation proceed substantially similar to operation discussed above with respect to the fourth switching cycle.

Figure 6:
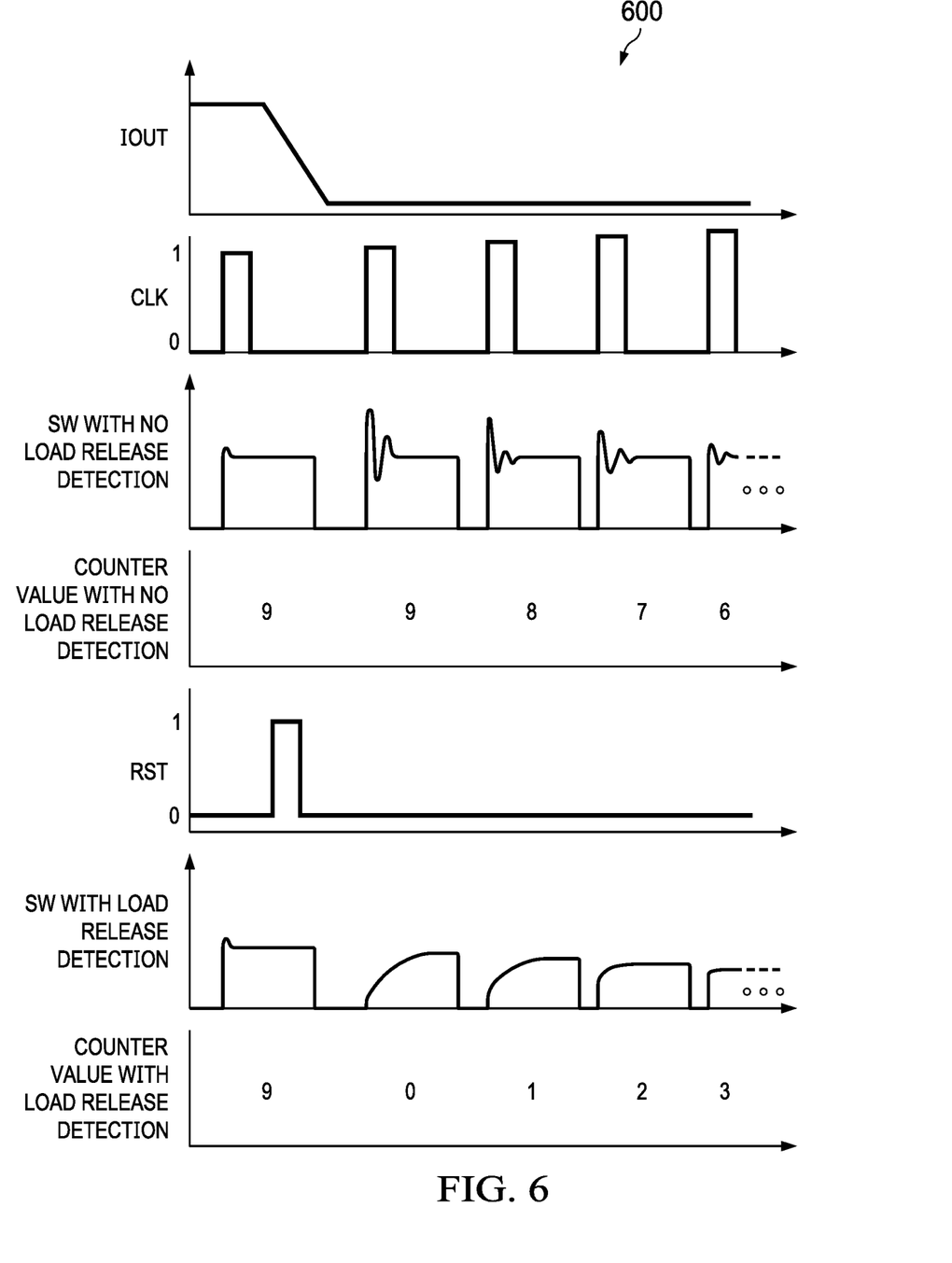
FIG. 6 shows a diagram of illustrative signal waveforms in accordance with various examples.

Turning now to FIG. 6, a diagram 600 of illustrative signal waveforms is shown. In at least some examples, the diagram 600 illustrates at least some signals present in the system 100, discussed above with respect to FIG. 1. Accordingly, reference is made to components of the system 100 in describing the diagram 600.

As shown by the diagram 600, a load release may occur in which IOUT decreases rapidly in value. In at least some examples, the signal CLK illustrated in the diagram 600 is an output of the PWM converter 106. At each rising edge of CLK, the power stage 108 generates HSCTRL having a duty cycle dependent on a value of a counter of the adaptive loop of the power stage 108. For example, as IOUT increases in value, the value of the counter increases and the duty cycle of HSCTRL increases. As IOUT decreases in value, the value of the counter decreases and the duty cycle of HSC-TRL decreases. Based on HSCTRL, the switching converter 110 generates a signal at a switch node (illustrated in the diagram 600 as SW).

However, as shown by the diagram 600, in some examples IOUT decreases in value too rapidly for the counter to keep up with the change in IOUT. Accordingly, the duty cycle of HSCTRL may not decrease in value to a degree corresponding to the decrease in value of IOUT for an extended period of time. In at least some examples, this causes ringing at the SW node and this ringing can undesirably affect operation of the system 100, as described elsewhere herein, when the system 100 does not include the load release detection circuit 112. For example, if the ringing is too great in magnitude, breakdown (e.g., irreparable damage or destruction) of one or more components of the system 100 may occur.

As further shown by the diagram 600, when the system 100 includes the load release detection circuit 112, the load release detection circuit 112 resets the counter. For example, when IOUT decreases rapidly in value, the load release detection circuit 112 outputs RST having an asserted value (or a de-asserted value, depending on an implementation of the system 100). Based on that asserted value, the counter is reset in a single switching cycle from a present value to zero (or some other value less than a normal cycle-to-cycle change in the counter value). In this way, the ringing at the SW node is prevented.

Figure 7:
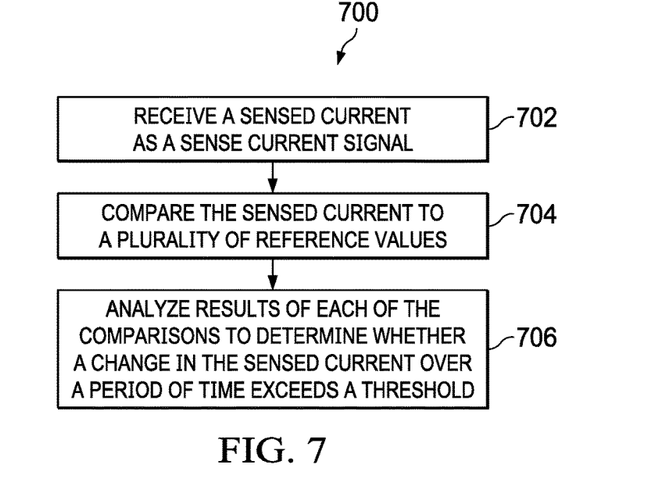
FIG. 7 shows a flowchart of an illustrative method in accordance with various examples.

Turning now to FIG. 7, a flowchart of an illustrative method 700 is shown. In at least some examples, the method 700 is implemented, at least partially, by the circuit 200 discussed above with respect to FIG. 2, the circuit 400 discussed above with respect to FIG. 4, and/or the circuit 500 discussed above with respect to FIG. 5. In some examples, the method 700 is implemented to detect a reset condition associated with a power converter. The reset condition could be a load release condition, a short condition, or condition definable by one or more threshold values and/or reference values. In at least some implementations, the reset condition indicates that a load release of a load of a power converter has been detected and an adaptive control loop at least partially controlling the power converter should be reset to protect the power converter from damage. In at least one implementation, the method 700 is implemented in a battery charger or a battery charger controller through which, and under the control of which, a rechargeable battery is charged or recharged. In another implementation, the method 700 is implemented in a power delivery circuit or a power delivery circuit controller through which, and under the control of which, power is delivered to a load.

At operation 702, a sensed current is received as a sense current signal. The sensed current, in at least some examples, is representative of an output current of a power converter. In some examples, the sensed current is that of a low-side power transistor of the power converter. In other examples, the sensed current is that of a high-side power transistor of the power converter. In yet other examples, sensed currents of both a high-side power transistor of the power converter and a low-side power transistor of the power converter are received. The received sense current signal may be a voltage signal representative of a current or may be a current signal.

At operation 704, the sensed current is compared to a plurality of reference values. In at least some examples, each comparison performed between the sensed current and one of the plurality of reference signals is performed by a respective comparator. Each comparator is, in some examples, a current sense comparator. The plurality of reference signals have values determined to have sufficient variation in value as to indicate a desired change in value of the sensed current over time. For example, in at least one implementation a first of the reference values is about 9 A and a second of the reference values is about 4.5 A.

At operation 706, results of each of the comparisons are analyzed to determine whether a change in the sensed current over a period of time (e.g., such as defined as a number of switching cycles of the power converter) exceeds a threshold. In at least some examples, the analysis is performed by a logic circuit that includes any combination of analog and/or digital components. In one implementation, the logic circuit performs the analysis by determining whether a pattern of values of the results of the comparisons over a period of time match a predefined pattern. The pattern, in some examples, is each result of the comparisons transitioning from an asserted value to a de-asserted value within four switching cycles of the power converter. In other examples, the pattern may be any predefined number of the results of the comparisons transitioning from asserted values to de-asserted values, or vice versa, within any predefined number of switching cycles of the power converter. When the pattern is identified, the logic circuit outputs an asserted signal. When the pattern is not identified, the output of the logic circuit is de-asserted. In at least some examples, after performing the operation 706 the method 700 returns to operation 702 such that the method 700 operates in a loop. In other examples, the method 700 is performed only once or performed periodically in a time-spaced manner.

While the operations of the method 700 have been discussed and labeled with numerical reference, in various examples the method 700 includes additional operations that are not recited herein. In some examples any one or more of the operations recited herein include one or more sub-operations (e.g., such as intermediary comparisons, logical operations, output selections such as via a multiplexer, etc.). In some examples any one or more of the operations recited herein is omitted. In some examples any one or more of the operations recited herein is performed in an order other than that presented herein (e.g., in a reverse order, substantially simultaneously, overlapping, etc.). Each of these alternatives is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g. a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET. MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of around connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a first comparator comprising a first input terminal coupled to a first node, a second input terminal coupled to a second node, and an output terminal;
   a second comparator comprising a first input terminal coupled to the first node, a second input terminal coupled to a third node, and an output terminal; and
   a logic circuit comprising a first input terminal coupled to the output terminal of the first comparator, a second input terminal coupled to the output terminal of the second comparator, and an output terminal, wherein the logic circuit is configured to determine a change in current over a change in time based on analyzing an output signal of the first comparator and an output signal of the second comparator over a plurality of sequential cycles of operation.

2. The circuit of claim 1, wherein the first node is configured to receive a current sense signal, wherein the second node is configured to receive a first reference value, and wherein the third node is configured to receive a second reference value.

3. The circuit of claim 1, wherein the logic circuit is configured to:

sample and store an output signal of the first comparator and an output signal of the second comparator for a plurality of sequential switching cycles of a power converter;

analyze the stored output signals of the first comparator and the second comparator for the plurality of sequential switching cycles to determine whether a predefined pattern exists in the stored output signals; and output an asserted signal when the predefined pattern exists in the stored output signals.

4. The circuit of claim 3, wherein the predefined pattern comprises the output signal of the first comparator and the output signal of the second comparator transitioning from asserted values to de-asserted values within a predetermined number of switching cycles of the power converter.

5. The circuit of claim 4, further comprising:
a transistor coupled to the first node; and
a driver comprising an adaptive control loop and having an input terminal coupled to the output terminal of the logic circuit and an output terminal configured to control the transistor.

6. The circuit of claim 5, wherein the logic circuit is configured to reset the adaptive control loop when the predefined pattern exists in the stored output signals to reset a counter of the adaptive control loop.

7. The circuit of claim 3, further comprising:
a zero voltage transition (ZVT) power converter comprising a low-side power transistor coupled to the first node; and
a driver comprising a ZVT adaptive control loop and having an input terminal coupled to the output terminal of the logic circuit and an output terminal configured to control at least a portion of the ZVT power converter, wherein the logic circuit is configured to reset the ZVT adaptive control loop when the predefined pattern exists in the stored output signals to reset a counter of the ZVT adaptive control loop.

8. A circuit, comprising:
a power converter driver configured to drive a power converter based at least partially on a zero voltage transition (ZVT) scheme controlled by a ZVT adaptive control loop that includes a counter that increments or decrements one unit per switching cycle of the power converter; and
a load release detection circuit coupled to the power converter driver and configured to couple to the power converter, wherein the load release detection circuit is configured to:
monitor a current of the power converter;
determine a rate of change of the current of the power converter according to comparisons of the current of the power converter to a plurality of reference values; and
output a reset signal having an asserted value when the rate of change of the current of the power converter exceeds a threshold.

9. The circuit of claim 8, wherein the load release detection circuit comprises:
a first comparator comprising a first input terminal coupled to a first node, a second input terminal coupled to a second node, and an output terminal;
a second comparator comprising a first input terminal coupled to the first node, a second input terminal coupled to a third node, and an output terminal, wherein a current sense signal representative of the current of the power converter is received at the first node, a first reference value is received at the second node, and a second reference value is received at the third node; and
a logic circuit comprising a first input terminal coupled to the output terminal of the first comparator, a second input terminal coupled to the output terminal of the second comparator, and an output terminal coupled to the power converter driver.

10. The circuit of claim 9, wherein to determine the rate of change of the current of the power converter and output the reset signal, the logic circuit is configured to:
sample and store an output signal of the first comparator and an output signal of the second comparator for a plurality of sequential switching cycles of the power converter;
analyze the stored output signals of the first comparator and the second comparator for the plurality of sequential switching cycles to determine whether a predefined pattern exists in the stored output signals; and
output the reset signal having the asserted value when the predefined pattern exists in the stored output signals.

11. The circuit of claim 10, wherein the predefined pattern comprises the output signal of the first comparator and the output signal of the second comparator transitioning from asserted values to de-asserted values within four switching cycles of the power converter.

12. The circuit of claim 10, wherein the logic circuit is configured to reset the ZVT adaptive control loop when the predefined pattern exists in the stored output signals to reset the counter of the ZVT adaptive control loop to a default value without decrementing or incrementing one unit per switching cycle to the default value.

13. The circuit of claim 8, wherein the load release detection circuit comprises:
a first sample and hold circuit comprising a first input terminal coupled to a first node and an output terminal;
a second sample and hold circuit comprising an input terminal coupled to the output terminal of the first sample and hold circuit and an output terminal coupled to a second node;
a third sample and hold circuit comprising an input terminal coupled to the first node and an output terminal;
a first comparator comprising a first input terminal coupled to the output terminal of the third sample and hold circuit, a second input terminal coupled to a third node, and an output terminal;
a second comparator comprising a first input terminal coupled to the second node, a second input terminal coupled to the third node, and an output terminal;
a summation circuit comprising a first input terminal coupled to a fourth node, a second input terminal coupled to a fifth node, and an output terminal coupled to the third node; and
a logic circuit comprising a first input terminal coupled to the output terminal of the first comparator, a second input terminal coupled to the output terminal of the second comparator, and an output terminal coupled to the power converter driver.

14. The circuit of claim 13, wherein the first node is configured to receive a first current sense signal, wherein the fourth node is configured to receive a second current sense signal, and wherein the fifth node is configured to receive an offset value.

15. The circuit of claim 14, wherein to determine the rate of change of the current of the power converter and output the reset signal, the load release detection circuit is configured to:
- sample and store, via the first sample and hold circuit, the second sample and hold circuit, and the third sample and hold circuit, a value of the first current sense signal for a plurality of switching cycles of the power converter;
- add, via the summation circuit, the offset value to the second current sense signal to generate a summed signal;
- compare, via the first comparator and the second comparator, a plurality of the stored values of the first current sense signal to the summed signal, wherein each of the plurality of stored values of the first current sense signal corresponds to a difference sequential switching cycle of the plurality of switching cycles of the power converter; and
- output the reset signal having the asserted value when at least one of the stored values of the first current sense signal is not less in value than the summed signal.

16. A system, comprising:
- a power converter comprising at least one power transistor;
- a power converter driver configured to control the at least one power transistor according to an adaptive control loop that exerts control based on a counter that increments or decrements on unit per switching cycle of the power converter; and
- an adaptive control loop reset circuit coupled to the power converter driver and configured to receive a signal representative of a current of the at least one power transistor, wherein the adaptive control loop reset circuit is configured to:
  - monitor a current of the at least one power transistor;
  - determine a rate of change of the at least one power transistor according to comparisons of the current of the at least one power transistor to a plurality of reference values; and
  - output a reset signal having an asserted value when the rate of change of the current of the at least one power transistor exceeds a threshold, the reset signal causing the power converter driver to reset the counter of the adaptive control loop to a default value without regard to a value of the counter of the adaptive control loop prior to the resetting.

17. The system of claim 16, wherein the load release detection circuit comprises:
- a first comparator comprising a first input terminal coupled to a first node, a second input terminal coupled to a second node, and an output terminal;
- a second comparator comprising a first input terminal coupled to the first node, a second input terminal coupled to a third node, and an output terminal, wherein a current sense signal representative of the current of the power converter is received at the first node, a first reference value is received at the second node, and a second reference value is received at the third node; and
- a logic circuit comprising a first input terminal coupled to the output terminal of the first comparator, a second input terminal coupled to the output terminal of the second comparator, and an output terminal coupled to the power converter driver.

18. The system of claim 17, wherein to determine the rate of change of the current of the power converter and output the reset signal, the logic circuit is configured to:
- sample and store an output signal of the first comparator and an output signal of the second comparator for a plurality of sequential switching cycles of the power converter;
- analyze the stored output signals of the first comparator and the second comparator for the plurality of sequential switching cycles to determine whether a predefined pattern exists in the stored output signals; and
- output the reset signal having the asserted value when the predefined pattern exists in the stored output signals.

19. The system of claim 16, wherein the load release detection circuit comprises:
- a first sample and hold circuit comprising a first input terminal coupled to a first node and an output terminal;
- a second sample and hold circuit comprising an input terminal coupled to the output terminal of the first sample and hold circuit and an output terminal coupled to a second node;
- a third sample and hold circuit comprising an input terminal coupled to the first node and an output terminal;
- a first comparator comprising a first input terminal coupled to the output terminal of the third sample and hold circuit, a second input terminal coupled to a third node, and an output terminal;
- a second comparator comprising a first input terminal coupled to the second node, a second input terminal coupled to the third node, and an output terminal;
- a summation circuit comprising a first input terminal coupled to a fourth node, a second input terminal coupled to a fifth node, and an output terminal coupled to the third node; and
- a logic circuit comprising a first input terminal coupled to the output terminal of the first comparator, a second input terminal coupled to the output terminal of the second comparator, and an output terminal coupled to the power converter driver.

20. The system of claim 19, wherein a first current sense signal is received at the first node, wherein a second current sense signal is received at the fourth node, and wherein an offset value is received at the fifth node, and wherein to determine the rate of change of the current of the power converter and output the reset signal, the load release detection circuit is configured to:
- sample and store, via the first sample and hold circuit, the second sample and hold circuit, and the third sample and hold circuit, a value of the first current sense signal for a plurality of switching cycles of the power converter;
- add, via the summation circuit, the offset value to the second current sense signal to generate a summed signal;
- compare, via the first comparator and the second comparator, a plurality of the stored values of the first current sense signal to the summed signal, wherein each of the plurality of stored values of the first current sense signal corresponds to a difference sequential switching cycle of the plurality of switching cycles of the power converter; and
- output the reset signal having the asserted value when at least one of the stored values of the first current sense signal is not less in value than the summed signal.

* * * * *